United States Patent
Shin

(10) Patent No.: US 12,127,343 B2
(45) Date of Patent: Oct. 22, 2024

(54) PRINTED CIRCUIT BOARD

(71) Applicant: SAMSUNG ELECTRO-MECHANICS CO., LTD., Suwon-si (KR)

(72) Inventor: Dong Joo Shin, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 556 days.

(21) Appl. No.: 17/133,860

(22) Filed: Dec. 24, 2020

(65) Prior Publication Data

US 2022/0132664 A1    Apr. 28, 2022

(30) Foreign Application Priority Data

Oct. 22, 2020 (KR) .................. 10-2020-0137606

(51) Int. Cl.
*H05K 1/02* (2006.01)
*H05K 1/11* (2006.01)

(52) U.S. Cl.
CPC ........... *H05K 1/115* (2013.01); *H05K 1/0298* (2013.01); *H05K 2201/0195* (2013.01)

(58) Field of Classification Search
CPC ............. H05K 1/0298; H05K 3/205; H05K 2203/122; H05K 3/387; H05K 2201/0195; H05K 3/4682; H05K 3/421; H05K 1/03; H05K 1/144; H05K 3/386; H05K 3/429; H05K 1/0237; H05K 3/4623; H05K 3/4626; H05K 2201/09481; H05K 2201/09645; H05K 1/112–115; C09J 7/30

See application file for complete search history.

(56) References Cited

U.S. PATENT DOCUMENTS

| | | | | |
|---|---|---|---|---|
| 5,032,694 A | * | 7/1991 | Ishihara | H01L 21/707 257/E21.535 |
| 9,368,428 B2 | | 6/2016 | Chitnis et al. | |
| 2005/0041405 A1 | * | 2/2005 | Kawagoe | H05K 1/115 174/262 |
| 2007/0284602 A1 | * | 12/2007 | Chitnis | H01L 33/382 438/455 |
| 2009/0200679 A1 | * | 8/2009 | Harada | H01L 21/76898 257/E21.597 |
| 2009/0286073 A1 | * | 11/2009 | Hamano | B32B 25/16 428/337 |
| 2012/0168792 A1 | | 7/2012 | Kang et al. | |
| 2016/0088736 A1 | * | 3/2016 | Sankman | H05K 1/162 361/748 |
| 2017/0086306 A1 | * | 3/2017 | Nakamura | H05K 3/4682 |
| 2019/0371717 A1 | * | 12/2019 | Kita | H01L 21/4857 |
| 2022/0095457 A1 | * | 3/2022 | Tuominen | H05K 3/425 |
| 2022/0132653 A1 | * | 4/2022 | Choi | H05K 1/0237 |

FOREIGN PATENT DOCUMENTS

KR  10-2012-0077876 A    7/2012
KR     10-1573302 B1   12/2015

* cited by examiner

*Primary Examiner* — Steven T Sawyer
(74) *Attorney, Agent, or Firm* — MORGAN, LEWIS & BOCKIUS LLP

(57) ABSTRACT

A printed circuit board includes a first insulating layer; a first circuit pattern embedded in the first insulating layer; a second insulating layer disposed on the first insulating layer; a via hole penetrating at least a portion of each of the first and second insulating layers; and an adhesive layer disposed on at least a portion of a side surface of the via hole.

24 Claims, 9 Drawing Sheets

PRINTED CIRCUIT BOARD

CROSS-REFERENCE TO RELATED APPLICATION(S)

This application claims the benefit of priority to Korean Patent Application No. 10-2020-0137606, filed on Oct. 22, 2020 in the Korean Intellectual Property Office, the disclosure of which is incorporated herein by reference in its entirety.

TECHNICAL FIELD

The present disclosure relates to a printed circuit board.

BACKGROUND

With the miniaturization and multifunctionalization of digital electronic products, functions of advanced components have also been improved. A printed circuit board (PCB) has also been designed to have a reduced thickness, high integration density, and a microcircuit, and a 5G antenna substrate has been required to have low dielectric loss, suitable for high-speed communications and a low roughness/non-roughness insulating layer.

SUMMARY

An aspect of the present disclosure is to provide a printed circuit board including a via collectively penetrating a plurality of insulating layers.

Another aspect of the present disclosure is to provide a printed circuit board which may secure adhesive force between insulating layers by including a bonding sheet between the insulating layers.

Another aspect of the present disclosure is to provide a printed circuit board including a protective layer covering an interfacial surface between insulating layers.

According to an aspect of the present disclosure, a printed circuit board includes a first insulating layer; a first circuit pattern embedded in the first insulating layer; a second insulating layer disposed on the first insulating layer; a via hole penetrating at least a portion of each of the first and second insulating layers; and an adhesive layer disposed on at least a portion of a side surface of the via hole.

According to another aspect of the present disclosure, a printed circuit board includes a first insulating layer; a second insulating layer alternately laminated with the first insulating layer; an adhesive layer disposed on one surface of the second insulating layer; and a circuit pattern disposed on the adhesive layer.

According to another aspect of the present disclosure, a printed circuit board includes a first insulating layer; a first circuit pattern embedded in the first insulating layer; a second insulating layer disposed on the first insulating layer; a second circuit pattern disposed on the second insulating layer; a via penetrating at least a portion of each of the first and second insulating layers, and connecting the first circuit pattern to the second circuit pattern; and an adhesive layer disposed between a portion of the via and a portion of the first and second insulating layers.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

Figure 1:
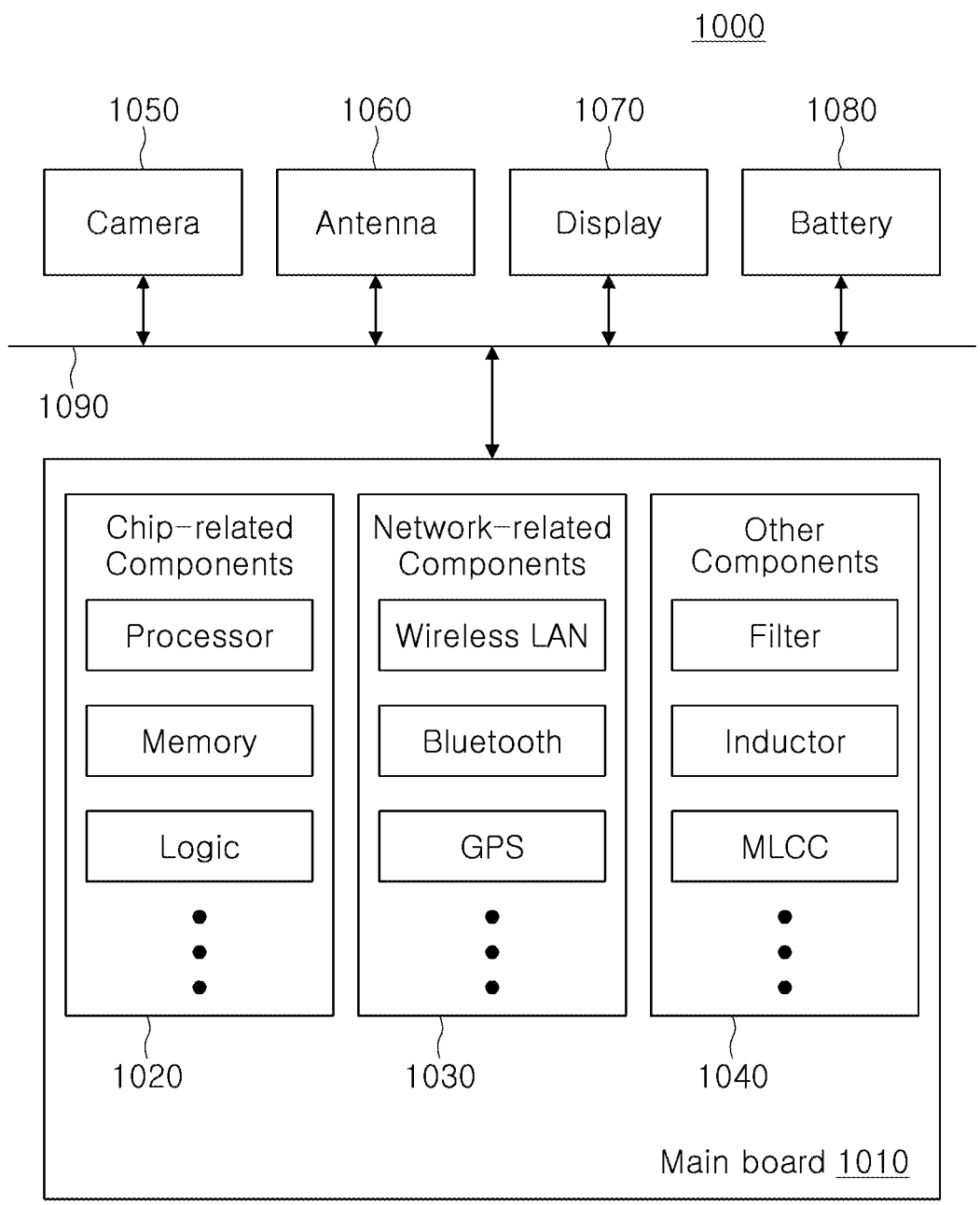
FIG. 1 is a block diagram illustrating an example of an electronic device system.

FIG. 1 is a block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. Also, the chip related components 1020 may be combined with each other. The chip related components 1020 may have a package form including the above-described chip.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. Also, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. Also, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. However, these other components are not limited thereto, and may also include components used for various purposes, depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
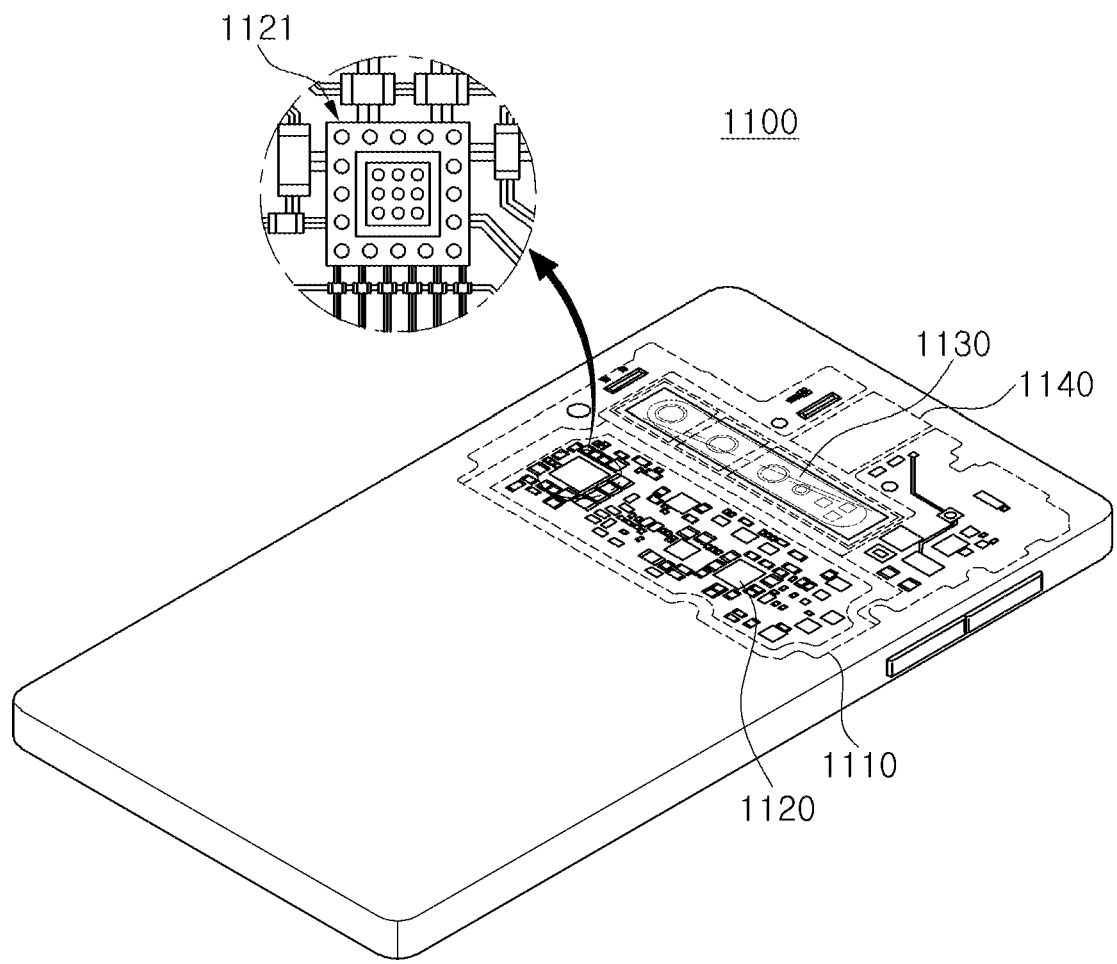
FIG. 2 is a perspective diagram illustrating an example of an electronic device.

FIG. 2 is a perspective diagram illustrating an example of an electronic device.

Referring to FIG. 2, the electronic device may be implemented by a smartphone 1100. A motherboard 1110 may be accommodated in a smartphone 1100, and various electronic components 1120 may be physically or electrically connected to the motherboard 1110. The camera module 1130 and/or the speaker 1140 may be accommodated therein. Some of the components 1120 may be the chip related components, such as a component package 1121, for example, but an exemplary embodiment thereof is not limited thereto. In the component package 1121, a plurality of electronic components may be disposed on a multilayer printed circuit board in the form of surface mounting, but an exemplary embodiment thereof is not limited thereto. The electronic device is not necessarily limited to the smartphone 1100, and may be other electronic devices as described above.

Figure 3:
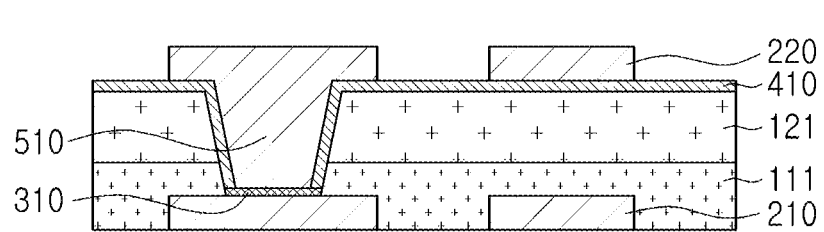
FIG. 3 is a cross-sectional diagram illustrating an example of a printed circuit board according to a first exemplary embodiment of the present disclosure.

FIG. 3 is a cross-sectional diagram illustrating an example of a printed circuit board according to a first exemplary embodiment.

Referring to FIG. 3, a printed circuit board 100A according to the first embodiment may include a first insulating layer 111, a first circuit pattern 210 buried in the first insulating layer 111, a second insulating layer 121 disposed on the first insulating layer 111, a first via 510 penetrating the first and second insulating layers 111 and 121, a surface treatment layer 310 disposed on an interfacial surface between the first circuit pattern 210 and the first via 510, an adhesive layer 410 extending from a side surface of the first via 510 to an upper surface of the second insulating layer 121, and a second circuit pattern 220 disposed on the adhesive layer 410.

According to an exemplary embodiment of the present disclosure, the adhesive layer 410 may be disposed between a portion of the first via 510 and a portion of the first and second insulating layers 111 and 121. An upper surface of the first circuit pattern 210 may be embedded in the first insulating layer 111, and a lower surface of the first circuit pattern 210 may be exposed to a lower surface of the first insulating layer 111. The upper surface of the first circuit pattern 210 may deviate from an upper surface of the first insulating layer 111.

In the printed circuit board 100A of the first exemplary embodiment, since the via 501 penetrates at least a portion of each of the first and second insulating layers 111 and 121, an interfacial surface between the first insulating layer 111 and the second insulating layer 121 may be exposed to a side surface of the via 501. Accordingly, in a general printed circuit board, in a process of plating the via 501, a plating solution may penetrate an interfacial surface between the first insulating layer 111 and the second insulating layer 121 such that cohesion force between the first insulating layer 111 and the second insulating layer 121 may degrade, and a plating defect may occur.

To prevent the above-described issue, the printed circuit board 100A in the exemplary embodiment may include an organic compound after processing a via hole V1 and before plating the first via 510, and the adhesive layer 410 formed by coating an organic layer may be disposed on a side surface of the via hole V1 such that a plating solution may be prevented from penetrating an interfacial surface between the first and second insulating layers 111 and 121.

Further, the adhesive layer 410 may extend to an upper portion of the second insulating layer 121, such that adhesion force may also be secured between the second circuit pattern 220 and the second insulating layer 121, and as the adhesive layer 410 may not be disposed on an interfacial surface between the first circuit pattern 210 and the first via 510, such that there may not be a problem in signal transmission between the first circuit pattern 210 and the first via 510.

Exemplary embodiments will be described in greater detail in accordance with FIGS. 3 to 13 illustrating a method of manufacturing a printed circuit board 100A.

In the description below, the elements included in the printed circuit board 100A will be described according to an exemplary embodiment.

The printed circuit board 100A according to the first exemplary embodiment may include a first insulating layer 111 and a second insulating layer 121, and in a printed circuit board having a structure in which the printed circuit board 100A is laminated, a first insulating layer 111 may include a plurality of first insulating layers 111, 112, and 113, and the second insulating layer 121 may also include a plurality of second insulating layers 121, 122, and 123. The plurality of first and second insulating layers 111, 112, 113, 121, 122, and 123 may include a smaller number of insulating layers, or may include a greater number of insulating layers.

The description of the first insulating layer 111 may also be applied to each of the plurality of first insulating layers 111, 112, and 113, and the description of the second insulating layer 121 may also be applied to the plurality of second insulating layers 121, 122, and 123. An exemplary embodiment will be described with reference to the first and second insulating layers 111 and 121.

An insulating material may be used as a material of the first insulating layer 111, and a polyphenylene ether (PPE)-based insulating material may be used as a bonding sheet, but an exemplary embodiment thereof is limited thereto. Any materials having a low dielectric constant (a dielectric constant, Dk) and low dielectric loss (dielectric loss tangent, Df) may be used.

An insulating material may be used as a material of the second insulating layer 121, and the insulating material may be formed of a material having a low dielectric constant and dielectric loss. Also, the second insulating layer 121 may include at least one of liquid crystal polymer (LCP), polytetrafluoroethylene (PTFE), polyphenylene ether (PPE), cyclo olefin polymer (COP), or perfluoroalkoxy (PFA), but an exemplary embodiment thereof is not limited thereto, and any material having a low dielectric constant and dielectric loss may be applied. Such a material may be suitable for reducing signal loss in a substrate transmitting a high frequency signal.

The first insulating layer 111 and the second insulating layer 121 may have different dielectric constants from each other. For example, the first insulating layer 111 may have a dielectric constant and a dielectric loss lower than those of the second insulating layer 121, but an exemplary embodiment thereof is not limited thereto. When the first insulating layer 111 has a dielectric constant and dielectric loss lower than those of the second insulating layer 121, as a dielectric constant and dielectric loss of the first insulating layer 111, when an high frequency signal is applied, transmission loss or a decrease in transmission speed may be reduced.

The first circuit pattern 210 may be buried in the first insulating layer 111, and the second circuit pattern 220 may be disposed on the second insulating layer 121. Also, in a printed circuit board described later, the second circuit pattern 220 may also be buried in the first insulating layer 112. In the printed circuit board 100A in the exemplary embodiment, the first insulating layer 111 may have a thickness greater than that of the first circuit pattern 210 buried in the first insulating layer 111. As the thickness of the first insulating layer 111 is greater than that of the first circuit pattern 210, a difference may be formed between the upper surfaces of the first insulating layer 111 and the first circuit pattern 210, and when the first via hole V1 is processed, a stepped portion may be formed on the upper surfaces of the first insulating layer 111 and the first circuit pattern 210. Accordingly, an interfacial surface between the first and second insulating layers 111 and 121 may be exposed to the side surface of the first via hole V1.

As a material of the first and second circuit patterns 210 and 220, a metal material may be used, and as the metal material, copper (Cu), aluminum (Al), silver (Ag), Tin (Sn), gold (Au), nickel (Ni), lead (Pb), titanium (Ti), or alloys thereof may be used. The first and second circuit patterns 210 and 220 may perform various functions according to a design. For example, the first and second circuit patterns 210 and 220 may include a ground pattern, a power pattern, a signal pattern, and the like. The signal pattern may include various signals other than a ground pattern and a power pattern, such as a data signal. Each of these patterns may have a shape of line, a shape of plane, or a pad shape. The first and second circuit patterns 210 and 220 may be formed by a plating process such as an additive process (AP), a semi-AP (SAP) process, a modified SAP (MSAP) process, a tenting (TT) process, or the like, and may thus include a seed layer, an electroless plating layer, and an electrolytic plating layer formed on the basis of the seed layer. A specific layer may further include copper foil.

The first via hole V1 may be processed to penetrate at least a portion of each of the first and second insulating layers 111 and 121. The method of processing the first via hole V1 may not be limited to any particular method, and a general method for processing a via such as a CO2 laser or a YAG laser processing method may be used, and by using a dry film resist, the via hole V1 may have a constant cross-sectional surface without being tapered. The first via 510 may be formed by filling the first via hole V1 with a metal material, and may thus penetrate at least a portion of each of the first and second insulating layers 111 and 121, and may electrically connect the second circuit patterns 210 and 220 to each other.

As a material of the first via 510, a metal material may be used, and as the metal material, copper (Cu), aluminum (Al), silver (Ag), Tin (Sn), gold (Au), nickel (Ni), lead (Pb), titanium (Ti), or alloys thereof may be used. The first via 510 may include a signal-use via, a ground-use via, a power-use via, and the like, according to a design. The first via 510 may be completely filled with a metal material, or a metal material may be formed along a wall surface of the via hole. The first via 510 may have a tapered shape. When the first via hole V1 is formed using a dry film, the first via hole V1 may not be tapered and may have a substantially constant cross-sectional surface. The first via 510 may be formed by a plating process, such as AP, SAP, MSAP, TT, or the like, for example, and may include an electroless plating layer, a seed layer, and an electroplating layer formed on the basis of the seed layer. A specific layer may further include copper foil.

The surface treatment layer 310 may be disposed on at least a portion of an upper surface of the first circuit pattern 210. Referring to FIG. 3, the surface treatment layer 310 may be disposed in a region of the surface of the first circuit pattern 210 exposed towards the first via hole V1 after processing of the first via hole V1. The surface treatment layer 310 may include a material exclusive to a material of the adhesive layer 410 disposed later. For example, the surface treatment layer 310 may be formed of a material not mixed with an organic material including an acrylic compound, and accordingly, the surface treatment layer 310 may not be disposed on the first circuit pattern 210 in a process of coating the adhesive layer 410 and may work as an anti-coating film so as to selectively coat the adhesive layer 410.

As a material of the adhesive layer 410, an organic material may be used. As the organic material, an acrylic compound may be used, and at least one of ethylene glycol dimathacrylate (EGDMA) and dimathacrylate (DMA) may be included, but an exemplary embodiment thereof is not limited thereto. Also, the material may include a functional group containing oxygen or nitrogen, but an exemplary embodiment thereof is not limited thereto. For example, the adhesive layer 410 may be disposed by coating an organic layer on one surface of the second insulating layer 121 and/or a side surface of the first via hole V1. The adhesive layer 410 may be formed by spin or spray coating an organic material. In this coating process, an upper surface of the first circuit pattern 210 exposed to the first via hole V1 may not be selectively coated with the adhesive layer 410 due to the surface treatment layer 310, and accordingly, the adhesive layer 410 may coat a region other than the upper surface of the first circuit pattern 210 exposed to the first via hole V1, and may extend and coat the side surface of the first via hole V1 and the upper surface of the second insulating layer 212. The adhesive layer 410 may include a compound covalently bonded to an insulating material, and may include a compound coordinately bonded to a metal forming a circuit pattern. Accordingly, adhesive force with the insulating material or the circuit pattern may be increased.

The adhesive layer 410 may not necessarily extend from the first via V1 to the upper surface of the second insulating layer 121. For example, the adhesive layer 410 may be disposed only on the side surface of the first via V1. In this case, the upper surface of the second insulating layer 121 may be exposed by patterning the organic layer-coated adhesive layer 410. For example, by etching a partial region of the adhesive layer 410 through dry or wet etching, adhesive layer 410 may be disposed only on the side surface of the first via hole V1 other than the upper surface of the first circuit pattern 21 and the upper surface of the second insulating layer 121.

In the printed circuit board 100A in FIG. 3, the adhesive layer 410 is covalently bonded to the first and second insulating layers 111 and 121, and may increase adhesive force with the adhesive layer 410 and the first and second insulating layers 111 and 121, and the adhesive layer 410 may be coordinately bonded to the second circuit pattern 220 and may increase adhesive force between the adhesive layer 410 and the second circuit pattern 220. Accordingly, even when roughness is not formed in the first and second insulating layers 111 and 121, or roughness is not extreme, sufficient adhesive force may be secured between the first and second insulating layers 111 and 121 and a delamination between the first and second insulating layers 111 and 121 may be prevented.

In the exemplary embodiment, the first via 510 filling the first via hole V1 may be formed to penetrate at least a portion of each of the first and second insulating layers 111 and 121.

The adhesive layer 410 may be disposed on at least a portion of aside surface of the first via hole V1. Accordingly, the interfacial surface between the first and second insulating layers 111 and 121 may be prevented from being exposed to the first via hole V1.

The first and second insulating layers 111 and 121 may include different types of insulating materials, and accordingly, when a general plating process is used, an air gap may be formed on the interfacial surface between the first and second insulating layers 111 and 121, and in the process of plating the first via 510, a metal material may permeate into the gap formed in the interfacial surface between the first and second insulating layers 111 and 121 such that adhesive force between the first and second insulating layers 111 and 121 may degrade.

However, in the exemplary embodiment, the adhesive layer 410 may be disposed on at least a portion of the side surface of the first via hole V1, thereby the interfacial surface between the first and second insulating layers 111 and 121 may be prevented from being exposed to the first via hole V1. As such, a metal material may be prevented from permeating into the air gap formed in the interfacial surface between the first and second insulating layers 111 and 121. Further, adhesive force of the first and second insulating layers 111 and 121 may be further increased through the covalent bonding between the adhesive layer 410 and the first and second insulating layers 111 and 121.

The surface treatment layer 310 may be disposed in a region in which the first circuit pattern 210 is exposed to the first via hole V1 as a separate layer, but as the surface treatment layer 310 is formed of a conductive film, the surface treatment layer 310 may be integrated with the first via 510 while the first via 510 is plated.

In the description below, processes for manufacturing the printed circuit board 100A according to the first exemplary embodiment will be described with reference to the drawings.

Figure 4:
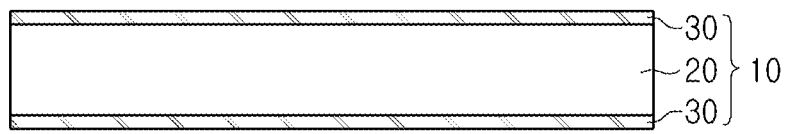
FIG. 4 is a cross-sectional diagram illustrating a copper clad laminate.

FIG. 4 is a cross-sectional diagram illustrating a copper clad laminate.

Referring to FIG. 4, a copper clad laminate (CCL) may be prepared. The copper clad laminate 10 may be used as a core during a process of manufacturing a printed circuit board, and may be manufactured by heat-pressing the insulating material 20 and the copper foil layer 30. The copper foil layer 30 may be used as a seed layer for plating thereon. The copper foil layer 30 may be separated from the printed circuit board after the printed circuit board is completed, such that the copper foil layer 30 may work as a carrier of a detach core in the exemplary embodiment.

Figure 5:
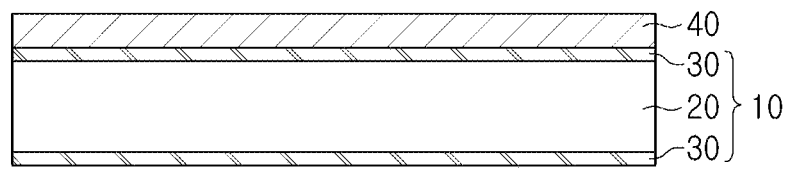
FIG. 5 is a cross-sectional diagram illustrating a structure in which a metal layer is disposed on a copper clad laminate.

FIG. 5 is a cross-sectional diagram illustrating a structure in which a metal layer is disposed on a copper clad laminate.

As illustrated in FIG. 5, the metal layer 40 may be disposed on one surface of the copper clad laminate 10, but an exemplary embodiment thereof is not limited thereto. The metal layer 40 may be disposed on both surfaces of the copper clad laminate 10, may be built up on the both surfaces by a double-sided build-up method, and may be separated thereafter, thereby manufacturing the printed circuit board 100A of the first exemplary embodiment.

Figure 6:
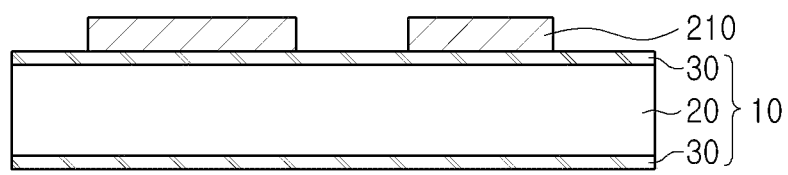
FIG. 6 is a cross-sectional diagram illustrating a structure in which a first circuit pattern is formed from a metal layer.

FIG. 6 is a cross-sectional diagram illustrating a structure in which a first circuit pattern is formed from a metal layer.

FIG. 6 illustrates a structure in which the metal layer 40 is patterned and the first circuit pattern 210 is disposed. The first circuit pattern 210 may be formed by patterning the metal layer 40. A metal material may be used for the first circuit pattern 210, and as the metal material, copper (Cu), aluminum (Al), silver (Ag), Tin (Sn), gold (Au), nickel (Ni), lead (Pb), titanium (Ti), or alloys thereof may be used. The first circuit pattern 210 may perform various functions according to a design. For example, the first circuit pattern 210 may include a ground pattern, a power pattern, a signal pattern, and the like. The signal pattern may include various signals other than a ground pattern and a power pattern, such as a data signal. Each of these patterns may have a shape of line, a shape of plane, or a pad shape. The first circuit pattern 210 may be formed by a plating process, such as AP, SAP, MSAP, TT, or the like, for example, and may thus include an electroless plating layer, a seed layer, and an electroplating layer formed on the basis of the seed layer. A specific layer may further include copper foil.

Figure 7:
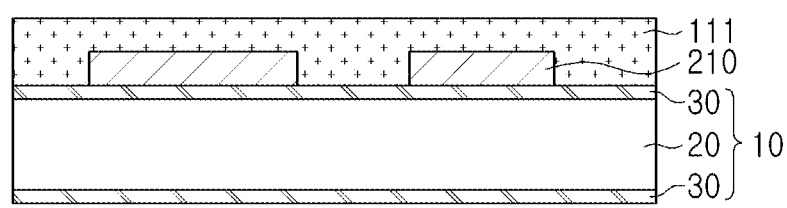
FIG. 7 is a cross-sectional diagram illustrating a structure in which a first insulating layer is laminated on the first circuit pattern illustrated in FIG. 6.

FIG. 7 is a cross-sectional diagram illustrating a structure in which a first insulating layer is laminated on the first circuit pattern illustrated in FIG. 6.

As illustrated in FIG. 7, a first insulating layer 111 may be disposed on the first circuit pattern 210. The first insulating layer 111 may cover the first circuit pattern 210, and a polyphenylene ether (PPE)-based insulating material may be used as a bonding sheet, but an exemplary embodiment thereof is limited thereto. Any material having a low dielectric constant (dielectric constant, Dk) and low dielectric loss (dielectric loss tangent, Df) may be applied. Since the first insulating layer 111 includes a material having a low dielectric constant (dielectric constant, Dk) and a dielectric loss (dielectric loss tangent, Df), signal loss of the first circuit pattern 210 may be reduced, and transmission of a high frequency signal may be effectively performed.

Figure 8:
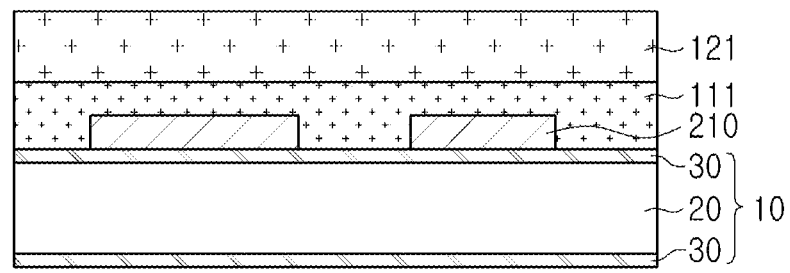
FIG. 8 is a cross-sectional diagram illustrating a structure in which a second insulating layer is laminated on a first insulating layer.

FIG. 8 is a cross-sectional diagram illustrating a structure in which a second insulating layer 121 is laminated on a first insulating layer 111. An insulating material may be used as a material of the second insulating layer 121, and may be formed of a material having a low dielectric constant and low dielectric loss as the insulating material. In particular, the second insulating layer 121 may include at least one of liquid crystal polymer (LCP), polytetrafluoroethylene (PTFE), polyphenylene Ether (PPE), cyclo olefin polymer (COP), or perfluoroalkoxy (PFA), but the material is not limited thereto. Any material having a low dielectric constant and low dielectric loss may be applied.

The second insulating layer 121 may include an insulating material different from that of the first insulating layer 111, and thus may have a different dielectric constant. For example, the first insulating layer 111 may have a dielectric constant and dielectric loss lower than those of the second insulating layer 121, but an exemplary embodiment thereof is not limited thereto. However, when the first insulating layer 111 has a dielectric constant and dielectric loss lower than those of the second insulating layer 121, as the first insulating layer 111 covering the first circuit pattern 210 has a low dielectric constant and low dielectric loss, transmission loss or a decrease in transmission speed may be reduced when a high frequency signal is applied.

Further, since the second insulating layer 121 and the first insulating layer 111 include different types of insulating materials, adhesive force between the second insulating layer 121 and the first insulating layer 111 may be problematic. Accordingly, by forming roughness on an interfacial surface between the first and second insulating layers 111 and 121, adhesive force therebetween may be increased.

Figure 9:
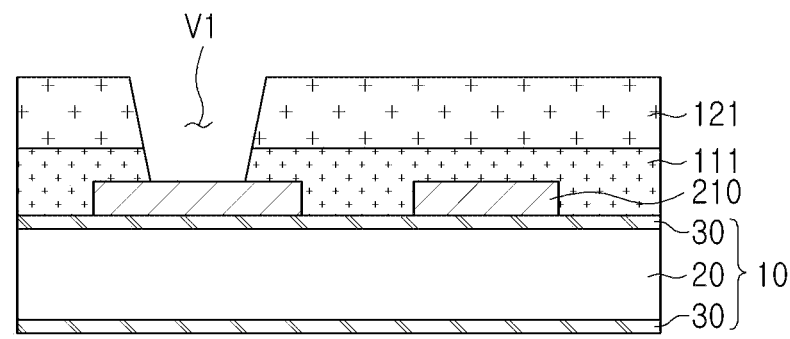
FIG. 9 is a cross-sectional diagram illustrating a structure in which a via hole is formed.

FIG. 9 is a cross-sectional diagram illustrating a structure in which a via hole is formed.

As illustrated in FIG. 9, a first via hole V1 penetrating at least a portion of each of the first and second insulating layers 111 and 121 may be formed. The first via hole V1 may be processed using a conventional via hole processing method, and may be processed using a CO2 laser or a YAG laser, for example, but an exemplary embodiment thereof is not limited thereto.

The first via hole V1 may be formed to expose at least a portion of the upper surface of the first circuit pattern 210. Accordingly, the first circuit pattern 210 may function as a stopper layer when the first via hole V1 is processed, and the first circuit pattern 210 may have roughness due to the laser process.

As the first via hole V1 penetrates at least a portion of each of the first and second insulating layers 111 and 121, the interfacial surface between the first and second insulating layers 111 and 121 may be exposed towards a side surface of the via hole V1.

Figure 10:
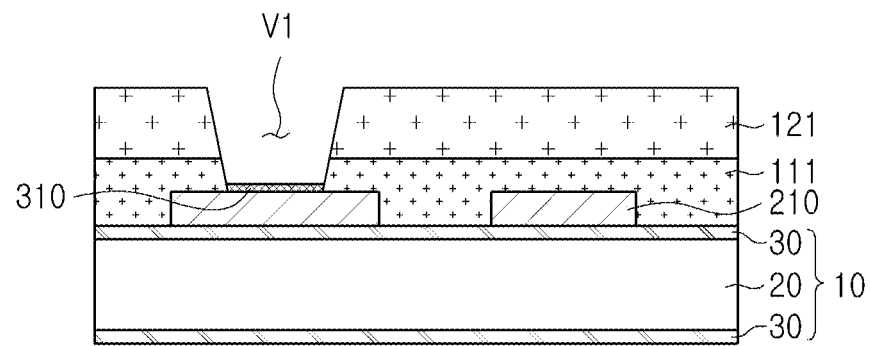
FIG. 10 is a cross-sectional diagram illustrating a structure in which a surface treatment layer is disposed.

FIG. 10 is a cross-sectional diagram illustrating a structure in which a surface treatment layer is disposed.

As illustrated in FIG. 10, a surface pre-treatment process may be performed on an upper surface of the first circuit pattern 210 exposed to the first via hole V1. Through the above-described surface pre-treatment process, a surface treatment layer 310 may be disposed on the upper surface of the first circuit pattern 210 exposed to the first via hole V1. As described above, the surface treatment layer 310 may include a material not mixed with an organic layer. Also, for electrical connection with the first via 510 to be disposed later, the surface treatment layer 310 may be a conductive film including a metal material. As the metal material, copper (Cu), aluminum (Al), silver (Ag), tin (Sn), gold (Au), nickel (Ni), lead (Pb), titanium (Ti), or alloys thereof may be used.

Since the surface treatment layer 310 includes a conductive film, in the printed circuit board 100A in the first exemplary embodiment, even though the surface treatment layer 310 is disposed on the first circuit pattern 210, the configuration may not disturb electrical connection between the first circuit pattern 210 and the via 510 to be disposed on the first circuit pattern 210.

Figure 11:
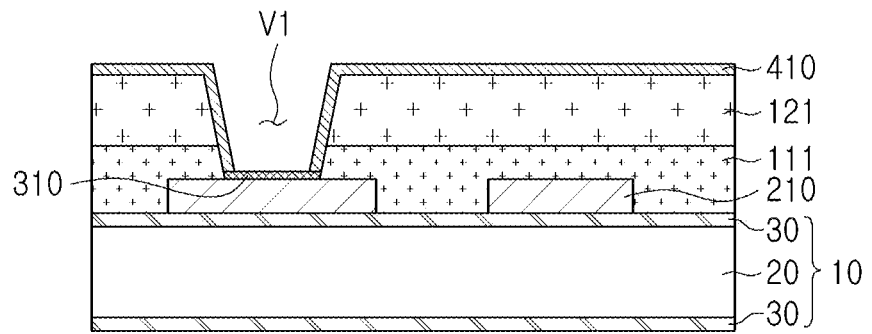
FIG. 11 is a cross-sectional diagram illustrating a structure in which an adhesive layer is disposed.

FIG. 11 is a cross-sectional diagram illustrating a structure in which an adhesive layer is disposed.

As illustrated in FIG. 11, the adhesive layer 410 may be coated on the structure of FIG. 10. The adhesive layer 410 may be formed by coating an organic layer and may include an organic compound. As the organic compound, an acrylic compound may be used, and at least one of Ethylene Glycol dimathacrylate (EGDMA) and dimathacrylate (DMA) may be included, but an exemplary embodiment thereof is not limited thereto. Also, a component of the organic layer 30 may be a compound having a functional group including oxygen or nitrogen, and may include an NH—R—NH or OH—R—OH compound.

The adhesive layer 410 may be disposed by coating one surface of the second insulating layer 121 and/or on a side surface of the first via hole V1 with an organic layer. In this case, since the surface treatment layer 310 covers the upper surface of the first circuit pattern 210 exposed into the first via hole V1, the adhesive layer 410 may not be disposed on the upper surfaces of the first circuit pattern 210 and the surface treatment layer 310. Accordingly, in the exemplary embodiment, the adhesive layer 410 may be selectively disposed.

The adhesive layer 410 may include a compound covalently bonded to an insulating material, and may include a compound coordinately bonded to a metal included in a circuit pattern. Accordingly, the adhesive layer 410 may form covalent bonding on the interfacial surface with the first and second insulating layers 111 and 121, thereby increasing adhesive force therebetween.

Further, as the adhesive layer 410 is coated on at least a portion of the side surface of the first via hole V1, the interfacial surface between the first insulating layer and the second insulating layer 111 and 121 may cover a region exposed to the side surface of the first via hole V1. Accordingly, peeling of the first and second insulating layers 111 and 121 may be prevented.

Figure 12:
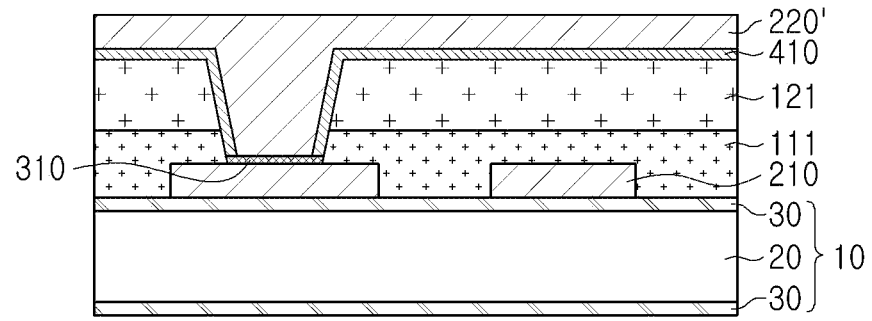
FIG. 12 is a cross-sectional diagram illustrating a structure in which a metal layer is disposed on an adhesive layer and a surface treatment layer.

FIG. 12 is a cross-sectional diagram illustrating a structure in which a metal layer is disposed on an adhesive layer and a surface treatment layer.

As illustrated in FIG. 12, a plating process may be performed on the internal region of the first via hole V1 and the upper surface of the adhesive layer 410, and the plating layer 220' may be disposed. The plating layer 220' may include a seed layer, an electroless plating layer, and an electroplating layer formed on the basis of the seed layer.

Figure 13:
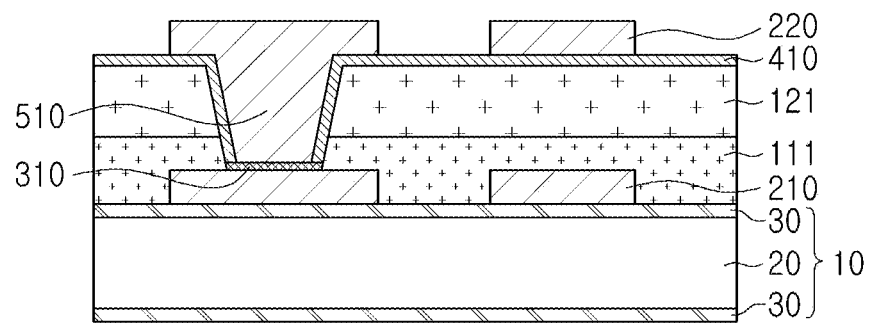
FIG. 13 is a cross-sectional diagram illustrating a structure in which a second circuit pattern is formed through patterning a metal layer.

FIG. 13 is a cross-sectional diagram illustrating a structure in which a second circuit pattern is formed through patterning a metal layer.

The second circuit pattern 220 may be formed by patterning the plating layer 220'. A metal material may be used for the second circuit pattern 220, and as the metal material, copper (Cu), aluminum (Al), silver (Ag), Tin (Sn), gold (Au), nickel (Ni), lead (Pb), titanium (Ti), or alloys thereof may be used. The second circuit pattern 220 may perform various functions according to a design. For example, the first circuit pattern 210 may include a ground pattern, a power pattern, a signal pattern, and the like. The signal pattern may include various signals other than a ground pattern and a power pattern, such as a data signal. Each of these patterns may have a shape of line, a shape of plane, or a pad shape. The second circuit pattern 220 may be formed by a plating process, such as AP, SAP, MSAP, TT, or the like, for example, and may thus include an electroless plating layer, a seed layer, and an electroplating layer formed on the basis of the seed layer. A specific layer may further include copper foil. The surface treatment layer 310 may be disposed in a region where the first circuit pattern 210 is exposed to the first via hole V1 and may be present as a separate layer as illustrated in FIG. 12, but as the first circuit pattern 210 is composed of a conductive film, the first circuit pattern 210 may be integrated with the first via 510 when the first via 510 is plated.

After the second circuit pattern 220 is patterned as in FIG. 13, the lower copper clad laminate 10 may be peeled off, such that the structure of the printed circuit board 100A of the first exemplary embodiment may be derived.

Although not illustrated, a solder resist layer having an opening may be further disposed on an outermost layer of the printed circuit board 100A, such that a pattern of the outermost layer may be partially exposed and protected. For example, each of the first circuit pattern 210 of the uppermost layer and the second circuit pattern 220 of the uppermost layer of the printed circuit board 100A may have a structure exposed by an opening of the solder resist layer.

Although not illustrated, a connection pad and/or a solder bump may be disposed in the opening of the solder resist layer and may be connected to an external electronic component, and may be connected to another package, such that a package on package (POP) structure may be formed.

Figure 14:
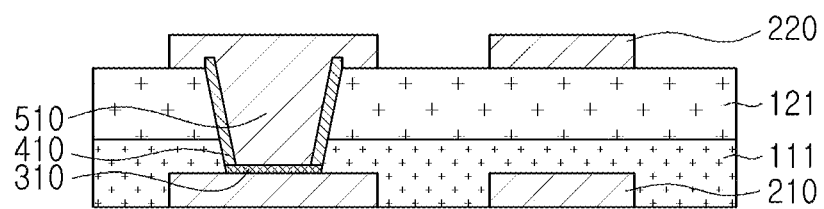
FIG. 14 is a cross-sectional diagram illustrating a structure of a printed circuit board according to a second exemplary embodiment, which may be manufactured in a state in which the adhesive layer has been partially patterned.

FIG. 14 is a cross-sectional diagram illustrating a structure of a printed circuit board according to a second exemplary embodiment, which may be manufactured in a state in which the adhesive layer has been partially patterned.

The printed circuit board 100B according to a second exemplary embodiment may have a structure in which the adhesive layer 410 is partially patterned.

The printed circuit board 100B in the second exemplary embodiment may be manufactured in the same manner as the printed circuit board 100A of the first exemplary embodiment according to FIGS. 4 to 11. Thereafter, the adhesive layer 410 extending from the first via hole V1 to the upper surface of the second insulating layer 121 may be patterned. Differently from the first exemplary embodiment 100A, the adhesive layer 410 may not necessarily extend along the upper surface of the second insulating layer 121 from the side surface of the first via 510. As in the second exemplary embodiment 100B, the adhesive layer 410 may be disposed only on the side surface of the first via 510 if desired. Alternatively, although not illustrated, the adhesive layer 410 may be disposed only on the upper surface of the second insulating layer 121. In this case, after the organic layer is coated, the coated organic layer may be patterned to selectively disposed the organic layer.

In the printed circuit board in the second exemplary embodiment in FIG. 14, the adhesive layer 410 is disposed by coating an organic film on a region other than the region in which surface treatment layer 310 is disposed, and the adhesive layer 410 disposed in a region other than the first via hole V1 may be etched and removed using an etching resist. In other words, the adhesive layer 410 disposed on the upper surface of the second insulating layer 121 may be selectively removed. As a method of removing the adhesive layer 410, dry etching or wet etching may be used as an example, but a selective removal process such as a sandblasting process may also be used.

When the adhesive layer 410 is removed, the resist remains in a region other than the upper surface of the second insulating layer 121 when the etching is performed. Accordingly, at least a portion of the adhesive layer 410 may have a shape extending from the side surface of the first via 510 and protruding from the upper surface of the second insulating layer 121 as illustrated in FIG. 14. However, an exemplary embodiment thereof is not limited thereto, and the adhesive layer 410 may be disposed to not protrude from the upper surface of the second insulating layer 121.

In the printed circuit board 100B in the second exemplary embodiment, at least a portion of the second circuit pattern 220 disposed on the second insulating layer 121 may be disposed to be in contact with the second insulating layer 121. Accordingly, as compared to the printed circuit board 100A of the first exemplary embodiment, a printed circuit board having a reduced thickness may be obtained, as the adhesive layer 410 is disposed on the side surface of the first via 510, a plating defect may be prevented and adhesive force between the first and second insulating layers 111 and 121 may be secured.

In addition to the disposition of the adhesive layer 410, the other same elements as those of the printed circuit board 100A of the first exemplary embodiment may also be applied to the printed circuit board 100B of the second exemplary embodiment, the descriptions thereof will not be repeated.

Figure 15:
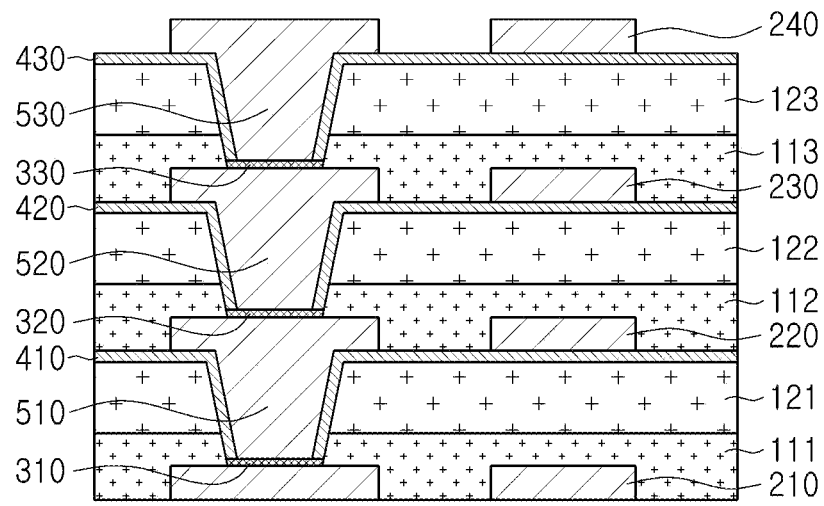
FIG. 15 is a cross-sectional diagram illustrating a structure in which a printed circuit board is built up according to a modified embodiment of the first exemplary embodiment.

FIG. 15 is a cross-sectional diagram illustrating a structure in which a printed circuit board is built up according to a modified embodiment of the first exemplary embodiment.

FIG. 15 illustrates a structure in which a printed circuit board 100A of the first exemplary embodiment is laminated a plurality of times.

In the case of the printed circuit board of FIG. 15, a plurality of first and second insulating layers 111 and 121 may be laminated, such that that the first insulating layer 111 may include a plurality of first insulating layers 111, 112 and 113, and similarly, the second insulating layer 121 may include a plurality of second insulating layers 121, 122, and 123. The plurality of first and second insulating layers 111 and 121 may include a smaller number of insulating layers, or may include a larger number of insulating layers. The description of the first and second insulating layers 111 and 121 described above may also be applied to the plurality of other first and second insulating layers 112, 113, 122 and 123.

Further, the printed circuit board of FIG. 15 may further include third and fourth circuit patterns 230 and 240 in addition to the first and second circuit patterns 210 and 220. As the printed circuit board has a structure in which a plurality of printed circuit boards are stacked, in the first exemplary embodiment, the second circuit pattern 220 protruding to an upper portion of the adhesive layer 410 may also have a structure in which the second circuit pattern 220 is buried by the first insulating layer 112 disposed in an upper portion. The third circuit pattern 230 may also be buried in the first insulating layer 113 similarly to the second circuit pattern 220, and may be disposed on the upper portion of the adhesive layer. The first to fourth circuit patterns 210, 220, 230, and 240 may include a smaller number of wiring layers, or may include a larger number of wiring layers. The description of the first and second circuit patterns 210 and 220 described above may also be applied to the third and fourth circuit patterns 230 and 240.

In the printed circuit board in FIG. 15, each of the plurality of first insulating layers 111, 112, and 113 may have a thickness greater than those of the first to third patterns 210, 220, and 230 buried in the plurality of first insulating layers 111, 112, and 113, respectively. As the thickness of each of the plurality of first insulating layers 111, 112, and 113 is thicker than that of the first to third circuit patterns 210, 220, and 230, a different may be formed between plurality of first insulating layers 111, 112, and 113 and the first to third circuit patterns 210, 220, and 230, respectively, and when the first to third via holes V1, V2, and V3 are processed, a stepped portion may be formed between upper surfaces of the plurality of first insulating layers 111, 112, and 113 and upper surfaces of the first to third circuit patterns 210, 220, and 230, respectively. Accordingly, an interfacial surface between the plurality of first insulating layers 111, 112 and 113 and the plurality of second insulating layers 121, 122, and 123 may be exposed to the side surfaces of the first to third via holes V1, V2, and V3.

Further, the printed circuit board in FIG. 15 may include the plurality of first to third via holes V1, V2, and V3, each of the plurality of first to third via holes V1, V2, and V3 may be filled with a plating material and may form a plurality of first to third vias 510, 520, and 530. The plurality of vias may include a less number of vias, or may include a larger number of vias. The description of the first via hole V1 above may also be applied to the second and third vias V2 and V3, and the description of the first via 510 may also be applied to the second and third vias 520 and 530.

Further, the printed circuit board in FIG. 15 may include a plurality of surface treatment layers 310, 320, and 330. The printed circuit board may also include a plurality of adhesive layers 410, 420, and 430.

Accordingly, in the printed circuit board in FIG. 15, the first to third circuit patterns 210, 220, and 230 may be buried by the plurality of first insulating layers 111, 112, and 113, respectively, and the second to fourth circuit patterns 220, 230, and 240 may be disposed on the upper portions of the adhesive layers 410, 420, and 430, respectively. The fourth circuit pattern 240 may protrude to the upper portion of the printed circuit board 100B, and although not illustrated, a solder resist layer having an opening may be further disposed on an outermost layer of the printed circuit board, such that the pattern of the outermost layer may be partially exposed and protected. For example, each of the first circuit pattern 210 of the lowermost layer and the fourth circuit pattern 240 of the uppermost layer of the printed circuit board in FIG. 15 may have a structure exposed by an opening of a solder resist layer.

Although not illustrated, a connection pad and/or a solder bump may be disposed in the opening of the solder resist layer and may be connected to an external electronic component, and may be connected to another package, and a package on package (POP) structure may be formed. The laminated structure of the printed circuit board of the first exemplary embodiment of FIG. 15 is not illustrated, but may also be applied to the second exemplary embodiment.

Figure 16:
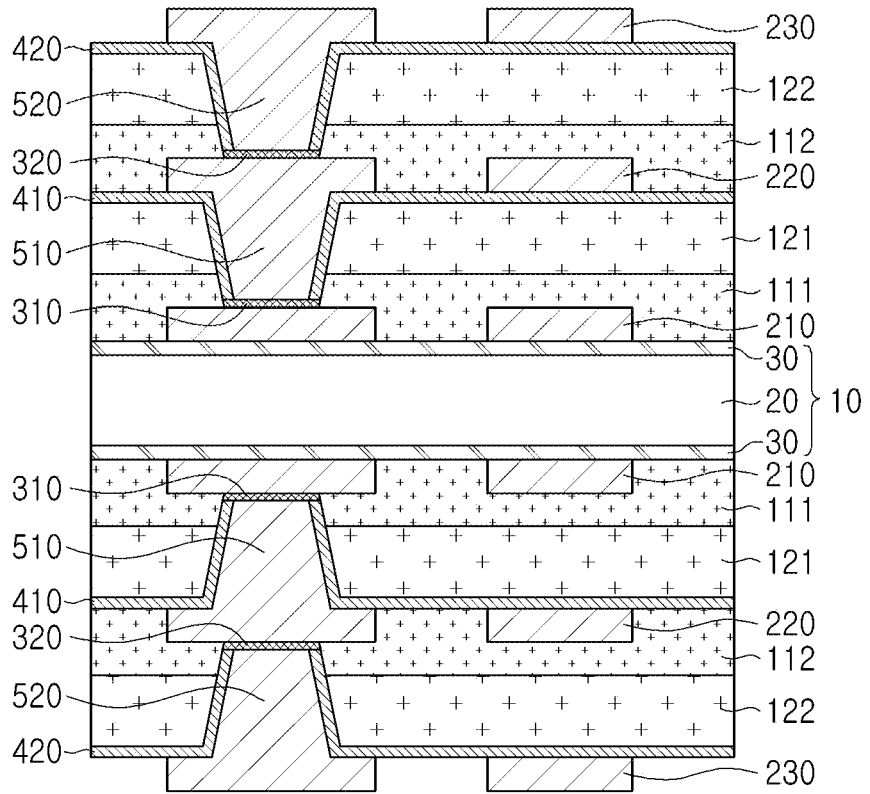
FIG. 16 is a cross-sectional diagram illustrating a double-sided build-up process for a printed circuit board.

FIG. 16 is a cross-sectional diagram illustrating a double-sided build-up process for a printed circuit board.

As illustrated in FIG. 16, the printed circuit board 100A in the first exemplary embodiment may be manufactured through a double-sided build-up process. FIG. 16 illustrates a state before each printed circuit board is separated from a copper clad laminate 10 which may function as a core layer in the double-sided build-up process, and FIG. 16 illustrates a structure in which from the second insulating layer 122 to the third circuit pattern 230 disposed on the second insulating layer 122 are laminated, but the peeling may occur in a structure in which a less number of elements are built up or a structure in which a greater number of elements are built up. Also, the printed circuit board 100B in the second exemplary embodiment may also be manufactured through a double-sided build-up process.

FIGS. 17 to 21 are diagrams illustrating a method of manufacturing a printed circuit board, performed after the process illustrated in FIG. 9, according to a third exemplary embodiment.

FIGS. 17 to 21 illustrate an example of a process of manufacturing a printed circuit board according to a third exemplary embodiment, and the same manufacturing method as in the first and second exemplary embodiments may be used up to FIG. 9, and the subsequent processes will be described. Therefore, the descriptions overlapping the descriptions of the method of manufacturing the printed circuit boards 100A and 100B of the first and second exemplary embodiments may also be applied to the process of manufacturing the printed circuit board 100C of the third exemplary embodiment.

Figure 17:
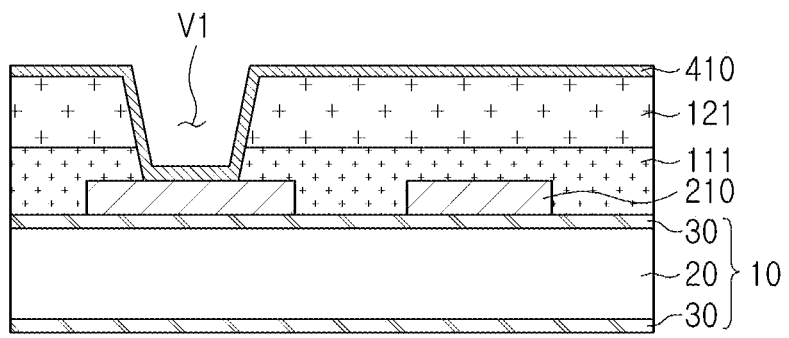
FIGS. 17 to 21 are diagrams illustrating a method of manufacturing a printed circuit board, performed after the process illustrated in FIG. 9, according to a third exemplary embodiment.

As illustrated in FIG. 17, to manufacture the printed circuit board 100C of the third exemplary embodiment, differently from the first exemplary embodiment, the adhesive layer 410 may be disposed by organic film coating without disposing the surface treatment layer 310. Differently from the printed circuit boards 100A and 100B of the first and second exemplary embodiments, in the printed circuit board 100C of the third exemplary embodiment, the adhesive layer 410 may also be disposed on the upper surface of the first circuit pattern 210 exposed into the first via hole V1.

Figure 18:
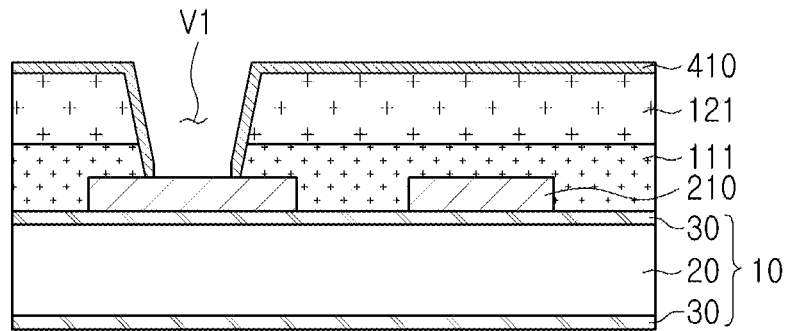

As illustrated in FIG. 18, a partial region of the adhesive layer 410 may be patterned and removed. Specifically, a partial region of the adhesive layer 410 disposed on the upper surface of the first circuit pattern 210 exposed into the first via hole V1 may be patterned and removed. As a method of removing the adhesive layer 410, the adhesive layer 410 disposed on the upper surface of the first circuit pattern 210 exposed into the first via hole V1 may be patterned and removed using an etching resist in the state illustrated in FIG. 17. Dry etching and wet etching may be used as an example, or a selective removal process such as a sandblasting process may be used. Accordingly, when the etching process is performed, an etching surface may be formed on an upper surface of the first circuit pattern 210 exposed into the first via hole V1, and roughness may be formed higher than that of the other surface. Also, when the sandblasting process is used, high roughness may be formed on the upper surface of the first circuit pattern 210 exposed into the first via hole V1 due to the sandblasting process, and in this case, the first circuit pattern 210 may function as a stopper layer.

Figure 19:
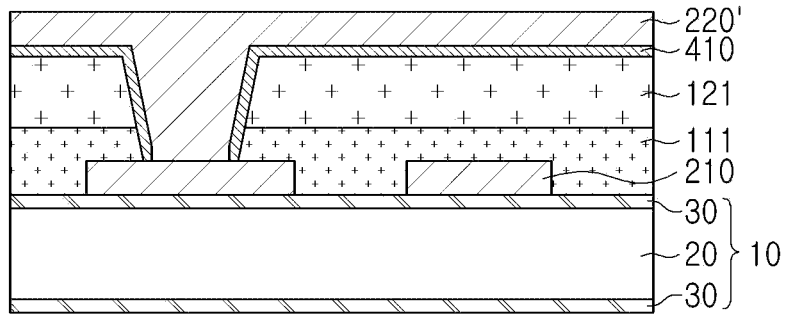
Figure 20:
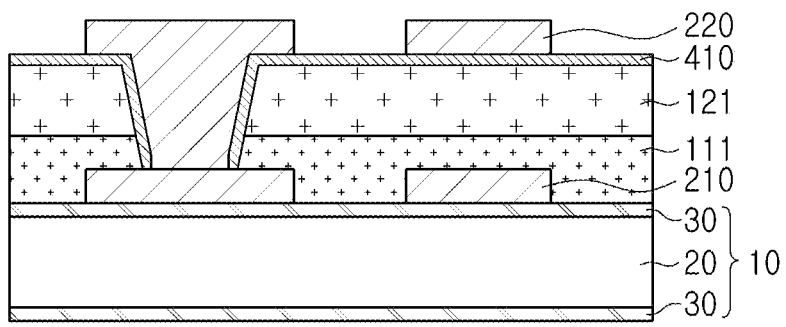

FIG. 19 illustrates a structure in which, after the adhesive layer 410 disposed on the upper surface of the first circuit pattern 210 exposed into the first via hole V1 is patterned and removed, the plating layer 220' is formed. Thereafter, as illustrated in FIG. 20, the second circuit pattern 220 may be disposed through a patterning process.

Figure 21:
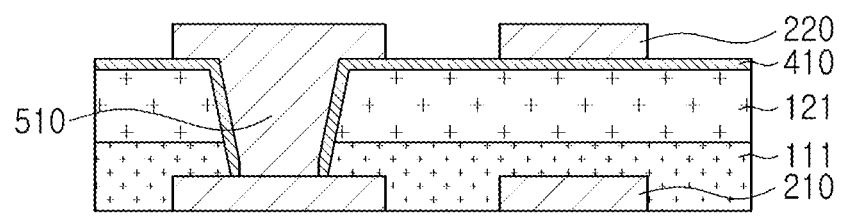

FIG. 21 illustrates a final structure of the printed circuit board 100C according to the third exemplary embodiment in the state after the copper clad laminate 10 is separated. In this case, as a partial region of the adhesive layer 410 disposed on the upper surface of the first circuit pattern 210 exposed into the first via hole V1 may be etched or removed by a blast process, high roughness may be formed on the upper surface of the lower first circuit pattern 210, such that relatively high roughness may be formed on the interfacial surface of the via 510 and the first circuit pattern 210 as compared to the interfacial surface between the via 510 and the adhesive layer 410.

When the adhesive layer 410 is removed, a resist may remain in a region other than the upper surface of the second insulating layer 121 when the etching is performed. Accordingly, at least a portion of the adhesive layer 410 may have a shape extending from the side surface of the first via 510 and protruding from the upper surface of the second insulating layer 121. However, an exemplary embodiment thereof is not limited thereto, and the adhesive layer 410 may be disposed to not protrude from the upper surface of the second insulating layer 121.

Figure 22:
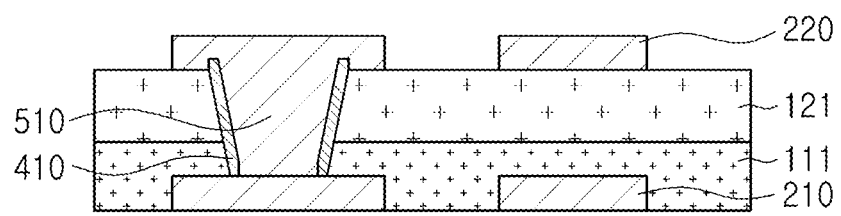
FIG. 22 is a cross-sectional diagram illustrating a structure of a printed circuit board manufactured by a manufacturing method the same as the method of manufacturing a printed circuit board according to the third exemplary embodiment in a state in which the adhesive layer illustrated in FIG. 18 has been further patterned, according to a fourth exemplary embodiment.

FIG. 22 is a cross-sectional diagram illustrating a structure of a printed circuit board manufactured by a manufacturing method the same as the method of manufacturing a printed circuit board according to the third exemplary embodiment in a state in which the adhesive layer illustrated in FIG. 18 has been further patterned, according to a fourth exemplary embodiment.

The printed circuit board 100D in the fourth exemplary embodiment may have a structure in which the adhesive layer 410 is further patterned on the upper surface of the second insulating layer 121.

The printed circuit board 100D in the fourth exemplary embodiment may also be manufactured in the same manner as the printed circuit board 100C of the third exemplary embodiment in FIGS. 4 to 9 and 17. Thereafter, when the adhesive layer 410 disposed on the upper surface of the first circuit pattern 210 exposed into the first via hole V1 is removed by patterning, the adhesive layer 410 disposed on the upper surface of the second insulating layer 121 may also be patterned. As in the third exemplary embodiment 100C, the adhesive layer 410 may not necessarily extend from the side surface of the first via 510 to the upper surface of the second insulating layer 121. In other words, as in the fourth exemplary embodiment 100D, the adhesive layer 410 may be disposed only on the side surface of the first via 510 if desired. Alternatively, although not illustrated, the adhesive layer 410 may also be disposed only on the upper surface of the second insulating layer 121. In this case, after the organic layer is coated, the organic layer may be selectively disposed by patterning the coated organic layer.

In the printed circuit board in the fourth exemplary embodiment in FIG. 22, the upper surfaces of the first via hole V1 and the second insulating layer 121 may be coated with an organic film, the adhesive layer 410 may be disposed, and the adhesive layer 410 disposed in a region other than the side surface of the first via hole V1 may be etched and removed using an etching resist. In other words, the adhesive layer 410 disposed on the upper surface of the first circuit pattern 210 exposed into the first via hole V1 and the adhesive layer 410 disposed on the upper surface of the second insulating layer 121 may be selectively removed. As a method of removing the adhesive layer 410, dry etching or wet etching may be used as an example, or a selective removal process such as a blast process may be used.

In the printed circuit board 100D of the fourth exemplary embodiment, at least a portion of the second circuit pattern 220 disposed on the second insulating layer 121 may be in contact with the second insulating layer 121. Accordingly, as compared to the printed circuit board 100C of the third exemplary embodiment, the printed circuit board may have a reduced thickness, and as the adhesive layer 410 is disposed on the side surface of the first via 510, a plating defect may be prevented, and adhesive force between the first and second insulating layers 111 and 121 may be secured.

Similarly to the first and second exemplary embodiments, the printed circuit boards 100C and 100D of the third and fourth exemplary embodiments may also have a structure in which printed circuit boards are laminated a plurality of times, or the printed circuit boards 100C and 100D may be simultaneously manufactured on both surfaces through a double-sided build-up process.

In addition to the disposition of the adhesive layer 410, the elements the same as those of the printed circuit board 100C according to the third exemplary embodiment may also be applied to the printed circuit board 100D of the fourth exemplary embodiment, overlapping descriptions will not be repeated.

According to the aforementioned exemplary embodiments, a printed circuit board including a via collectively penetrating a plurality of insulating layers may be provided.

Further, a printed circuit board which may secure cohesive force between insulating layers by including a bonding sheet between the insulating layers may be provided.

Further, a printed circuit board which, by including a protective layer covering an interfacial surface between insulating layers, may prevent a plating defect may be provided.

While the exemplary embodiments have been shown and described above, it will be apparent to those skilled in the art that modifications and variations could be made without departing from the scope of the present invention as defined by the appended claims.

What is claimed is:

1. A printed circuit board, comprising:
a first insulating layer;
a first circuit pattern embedded in the first insulating layer;
a second insulating layer disposed on the first insulating layer;
a via hole penetrating at least a portion of each of the first and second insulating layers; and
an organic adhesive layer disposed on at least a portion of a side surface of the via hole and extending to at least a portion of a region of the second insulating layer where a second circuit pattern is not disposed without covering a surface of the first circuit pattern exposed through the via hole.

2. The printed circuit board of claim 1, wherein a dielectric constant of the first insulating layer is less than a dielectric constant of the second insulating layer.

3. The printed circuit board of claim 2, wherein the organic adhesive layer covers an area of the side surface of the via hole, to which an interfacial surface between the first and second insulating layers exposed.

4. The printed circuit board comprising: a first insulating layer; a first circuit pattern embedded in the first insulating layer; a second insulating layer disposed on the first insulating layer; a via hole penetrating at least a portion of each of the first and second insulating layers; an organic adhesive layer disposed on at least a portion of a side surface of the via hole; and a surface treatment layer disposed on a portion of the first circuit pattern that is exposed to the via hole, a side surface of the surface treatment layer contacting the first insulating layer, wherein the organic adhesive layer is in contact with the surface treatment layer on the side surface of the via hole.

5. The printed circuit board of claim 3, further comprising a second circuit pattern disposed on the second insulating layer.

6. The printed circuit board of claim 5, wherein a portion of the organic adhesive layer protruding from an upper surface of the second insulating layer is embedded in the second circuit pattern.

7. The printed circuit board of claim 5, wherein the organic adhesive layer extends onto the upper surface of the second insulating layer, and wherein the second circuit pattern is in contact with the organic adhesive layer.

8. The printed circuit board of claim 7, further comprising a via disposed in the via hole,
wherein the via connects the first circuit pattern, and the second circuit pattern to one another.

9. The printed circuit board of claim 8, wherein the organic adhesive layer includes an acrylate compound.

10. The printed circuit board of claim 9, wherein the organic adhesive layer is covalently bonded to the first and second insulating layers, and is coordinately bonded to the via and the second circuit pattern.

11. A printed circuit board, comprising: a plurality of insulating layers; a plurality of organic adhesive layers, at least one of which is disposed on an entirety of an upper surface of at least one of the plurality of insulating layers; a plurality of circuit patterns each disposed on at least a portion of an upper surface of a respective one of the plurality of organic adhesive layers; and a plurality of vias each penetrating at least two of the plurality of insulating layers and connected to at least a portion of a respective one of the plurality of circuit patterns, wherein the plurality of organic adhesive layers do not cover respective portions of the plurality of circuit patterns exposed through respective of the plurality of vias wherein the plurality of organic adhesive layers extend to respective side surfaces of the plurality of vias, and are respectively disposed between a plurality of interfacial surfaces between the plurality of insulating layers and the plurality of vias.

12. The printed circuit board of claim 11, wherein at least a portion of the plurality of insulating layers covers at least a portion of the plurality of circuit patterns, respectively.

13. The printed circuit board of claim 11, wherein a surface treatment layer is disposed in an area of each of the plurality of circuit patterns, partially covered by a respective one of the plurality of insulating layers, is exposed to a respective one of the plurality of vias.

14. A printed circuit board, comprising: a first insulating layer; a first circuit pattern embedded in the first insulating layer; a second insulating layer disposed on the first insulating layer; a second circuit pattern disposed on the second insulating layer; a via penetrating at least a portion of each of the first and second insulating layers, and connecting the first circuit pattern to the second circuit pattern; and an organic adhesive layer disposed between a portion of the via and a portion of the first and second insulating layers, wherein the organic adhesive layer extends onto at least a portion of an upper surface of the second insulating layer where the second circuit pattern is not formed without covering a surface of the first circuit pattern exposed through the via.

15. The printed circuit board of claim 14, wherein the organic adhesive layer includes an organic compound.

16. The printed circuit board of claim 15, wherein the adhesive layer is covalently bonded to the first and second insulating layers, and is coordinately bonded to the via and the second circuit pattern.

17. The printed circuit board of claim 14, wherein the organic adhesive layer covers an area to which an interfacial surface between the first and second insulating layers exposed.

18. The printed circuit board of claim 14, wherein at least a portion of the organic adhesive layer is disposed between, and in contact with, the second insulating layer and the second circuit pattern.

19. The printed circuit board of claim 14, further comprising a surface treatment layer disposed between, and in contact with, a portion of the first circuit pattern and the via, wherein the organic adhesive layer is in contact with the surface treatment layer on a side surface of the via.

20. The printed circuit board of claim 19, wherein a portion of the organic adhesive layer protruding from an upper surface of the second insulating layer is embedded in the second circuit pattern.

21. The printed circuit board of claim 14, wherein an upper surface of the first circuit pattern is embedded in the first insulating layer, and a lower surface of the first circuit pattern is exposed to a lower surface of the first insulating layer, and
the upper surface of the first circuit pattern deviates from an upper surface of the first insulating layer.

22. The printed circuit board of claim 14, wherein a thickness of the first insulating layer is greater than a thickness of the first circuit pattern buried in the first insulating layer.

23. The printed circuit board of claim 14, wherein the first and second insulating layers have different insulating materials from each other.

24. The printed circuit board of claim 23, wherein a dielectric constant of the first insulating layers is less than a dielectric constant of the second insulating layer.

* * * * *